(12) United States Patent
Ko et al.

(10) Patent No.: US 8,692,353 B2
(45) Date of Patent: Apr. 8, 2014

(54) SEMICONDUCTOR STRUCTURE AND METHOD

(75) Inventors: Chun-Hung Ko, Hemei Township (TW); Jyh-Huei Chen, Hsin-Chu (TW); Ming-Jie Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 193 days.

(21) Appl. No.: 13/224,896

(22) Filed: Sep. 2, 2011

(65) Prior Publication Data
US 2013/0056830 A1    Mar. 7, 2013

(51) Int. Cl.
H01L 29/06    (2006.01)

(52) U.S. Cl.
USPC ..................... 257/513; 257/E29.02

(58) Field of Classification Search
USPC ..................... 257/374, 524, E29.02
See application file for complete search history.

(56) References Cited

U.S. PATENT DOCUMENTS

| | | | | |
|---|---|---|---|---|
| 5,858,830 A * | 1/1999 | Yoo et al. | ........................ | 438/241 |
| 6,462,373 B2 * | 10/2002 | Shimizu et al. | ............... | 257/315 |
| 6,589,854 B2 * | 7/2003 | Liu et al. | ........................ | 438/435 |
| 6,653,194 B1 * | 11/2003 | Park | ................................ | 438/296 |
| 6,723,658 B2 * | 4/2004 | Eissa et al. | ..................... | 438/745 |
| 6,849,519 B2 * | 2/2005 | Dong | .............................. | 438/424 |
| 7,002,210 B2 * | 2/2006 | Taya | .............................. | 257/339 |
| 7,037,785 B2 * | 5/2006 | Dong et al. | .................... | 438/259 |
| 7,115,940 B2 * | 10/2006 | Sumino et al. | ................. | 257/315 |
| 7,151,043 B2 * | 12/2006 | Kim et al. | ..................... | 438/435 |
| 7,303,957 B2 * | 12/2007 | Chi et al. | ....................... | 438/257 |
| 7,348,634 B2 * | 3/2008 | Furukawa et al. | ............ | 257/368 |
| 7,382,015 B2 * | 6/2008 | Iguchi et al. | ................... | 257/315 |
| 7,566,651 B2 * | 7/2009 | Wong et al. | ................... | 438/621 |
| 7,652,334 B2 * | 1/2010 | Furukawa et al. | ............ | 257/368 |
| 7,682,901 B2 * | 3/2010 | Kim | .............................. | 438/257 |

(Continued)

FOREIGN PATENT DOCUMENTS

JP    2011 066052 A    3/2011
KR    100326942 B1    3/2002

(Continued)

OTHER PUBLICATIONS

Sarajlic et al., Advanced plasma processing combined with trench isolation technology for fabrication and fast prototyping of high aspect ratio MEMS in standard silicon wafers, Journal of Micromechanics and Microengineering, 14, 2004, pp. S70-S75.*

*Primary Examiner* — David Vu
*Assistant Examiner* — Earl Taylor
(74) *Attorney, Agent, or Firm* — Slater & Matsil, L.L.P.

(57) ABSTRACT

An embodiment is a semiconductor structure. The semiconductor structure comprises at least two gate structures on a substrate. The gate structures define a recess between the gate structures, and the recess is defined by a depth in a vertical direction. The depth is from a top surface of at least one of the gate structures to below a top surface of the substrate, and the depth extends in an isolation region in the substrate. The semiconductor structure further comprises a filler material in the recess. The filler material has a first thickness in the vertical direction. The semiconductor structure also comprises an inter-layer dielectric layer in the recess and over the filler material. The inter-layer dielectric layer has a second thickness in the vertical direction below the top surface of the at least one of the gate structures. The first thickness is greater than the second thickness.

18 Claims, 4 Drawing Sheets

(56) References Cited

U.S. PATENT DOCUMENTS

| | | | |
|---|---|---|---|
| 7,723,772 B2 * | 5/2010 | Ozawa et al. | 257/314 |
| 7,777,294 B2 * | 8/2010 | Taya | 257/506 |
| 8,264,025 B2 * | 9/2012 | Lee et al. | 257/317 |
| 8,294,238 B2 * | 10/2012 | Kutsukake et al. | 257/506 |
| 2001/0009805 A1 | 7/2001 | Ha | |
| 2002/0163022 A1 | 11/2002 | Kosugi | |
| 2002/0179996 A1 * | 12/2002 | Tsuji et al. | 257/510 |
| 2004/0099900 A1 * | 5/2004 | Iguchi et al. | 257/315 |
| 2004/0175919 A1 | 9/2004 | Ha | |
| 2006/0027880 A1 * | 2/2006 | Taya | 257/392 |
| 2006/0160363 A1 * | 7/2006 | Furukawa et al. | 438/704 |
| 2006/0220148 A1 * | 10/2006 | Furukawa et al. | 257/374 |
| 2007/0007582 A1 * | 1/2007 | Hatakeyama | 257/316 |
| 2007/0059876 A1 * | 3/2007 | Chi et al. | 438/211 |
| 2008/0017932 A1 * | 1/2008 | Furukawa et al. | 257/374 |
| 2008/0237867 A1 * | 10/2008 | Wong et al. | 257/757 |
| 2009/0140320 A1 * | 6/2009 | Lee et al. | 257/321 |
| 2013/0056830 A1 * | 3/2013 | Ko et al. | 257/365 |
| 2013/0092985 A1 * | 4/2013 | Ko et al. | 257/288 |

FOREIGN PATENT DOCUMENTS

| | | |
|---|---|---|
| KR | 1020020096363 A | 12/2002 |
| KR | 1020070002783 A | 1/2007 |
| KR | 10-2007-0028891 | 3/2007 |
| KR | 10-2009-0056454 | 3/2009 |

* cited by examiner

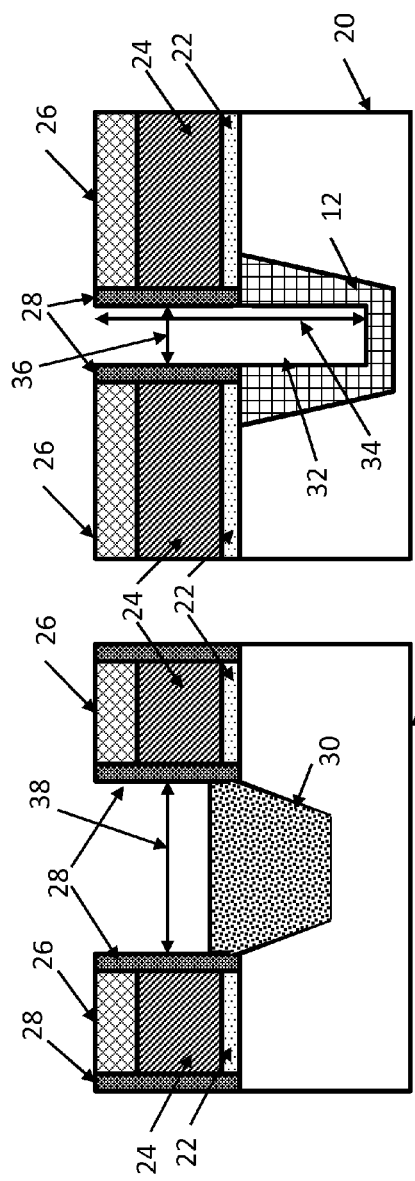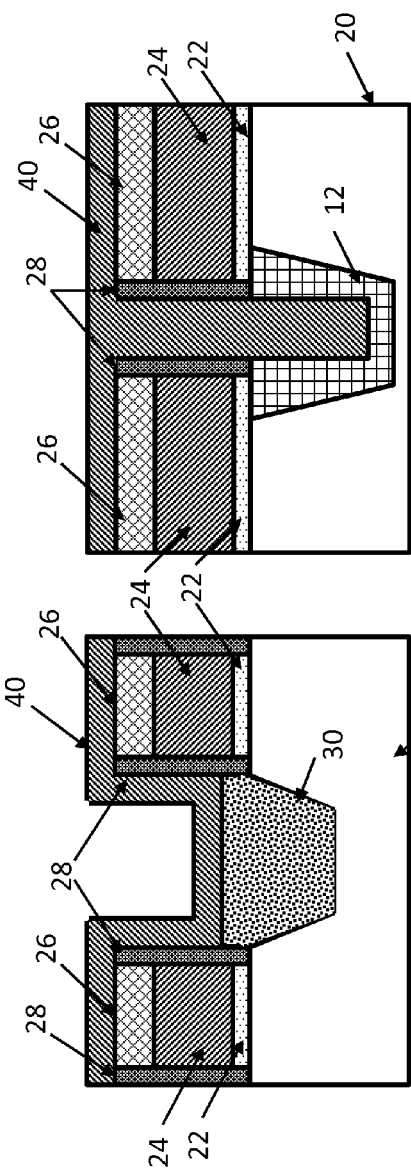

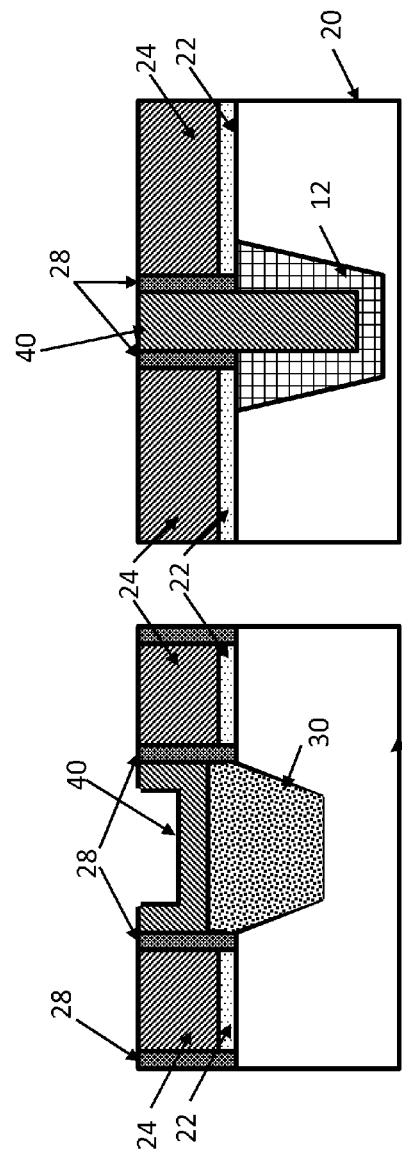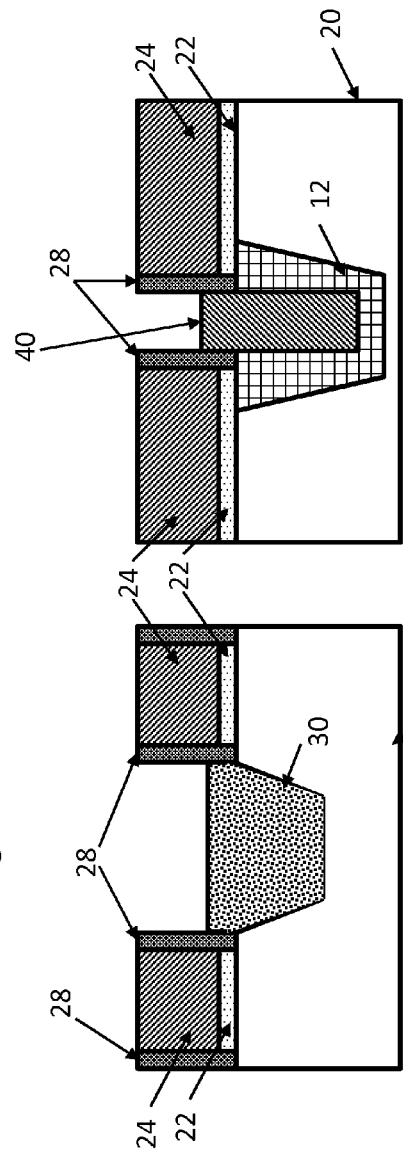

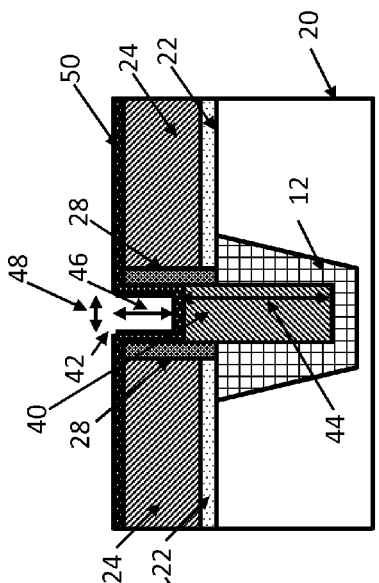
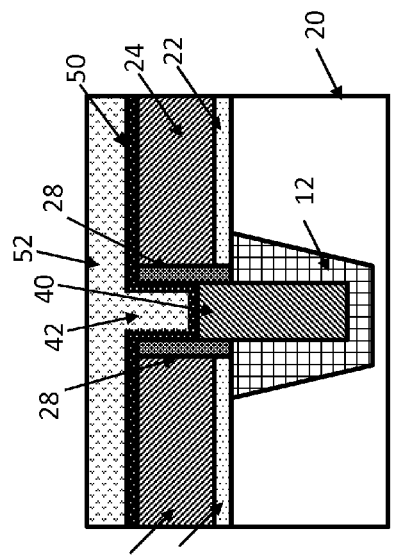
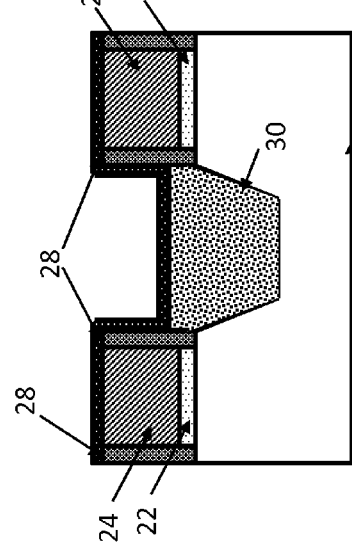
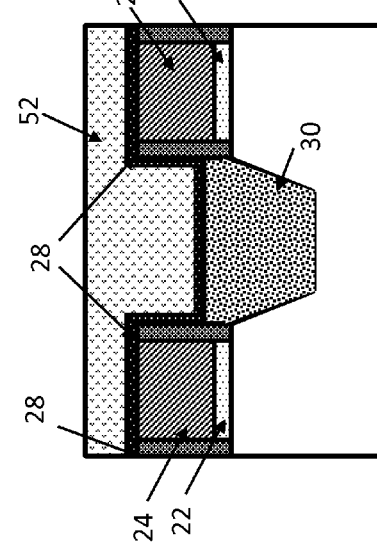

US 8,692,353 B2

SEMICONDUCTOR STRUCTURE AND METHOD

BACKGROUND

Since the development of the integrated circuit (IC), the semiconductor industry has sought to continue to improve the performance or size of the IC. Many of these improvements have focused on smaller feature sizes so that the speed of the IC can be increased. By decreasing the feature sizes, the density of devices (e.g., transistors, diodes, resistors, capacitors, etc.) on the IC has increased. By increasing the density, distances between devices generally decreases, which allows for a smaller resistance and capacitance between devices. Thus, a resistance-capacitance (RC) time constant can be decreased.

By decreasing features sizes and increasing density, material and processing challenges have generally occurred. In some instances, by increasing the density, volumes in which certain materials are to be deposited have decreased in size. This decrease in size may cause conventional processing and deposition techniques to not render acceptable structures. For example, the material deposited to fill the decreased volume may not actually fill the volume. Hence, voids in these volumes may occur.

If voids occur in a semiconductor structure, the structure may be defective. For example, with a void, leakage issues may occur rendering the structure unusable. Thus, for shrinking features size technologies, the yield of the structures can be negatively affected by using conventional processing and deposition techniques.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 2A and 2B are first cross section views of an SRAM structure during processing according to an embodiment;

FIGS. 3A and 3B are second cross section views of the SRAM structure during processing according to the embodiment;

FIGS. 4A and 4B are third cross section views of the SRAM structure during processing according to the embodiment;

FIGS. 5A and 5B are fourth cross section views of the SRAM structure during processing according to the embodiment;

FIGS. 6A and 6B are fifth cross section views of the SRAM structure during processing according to the embodiment; and FIGS. 7A and 7B are sixth cross section views of the SRAM structure during processing according to the embodiment.

DETAILED DESCRIPTION OF ILLUSTRATIVE EMBODIMENTS

Figure 1:
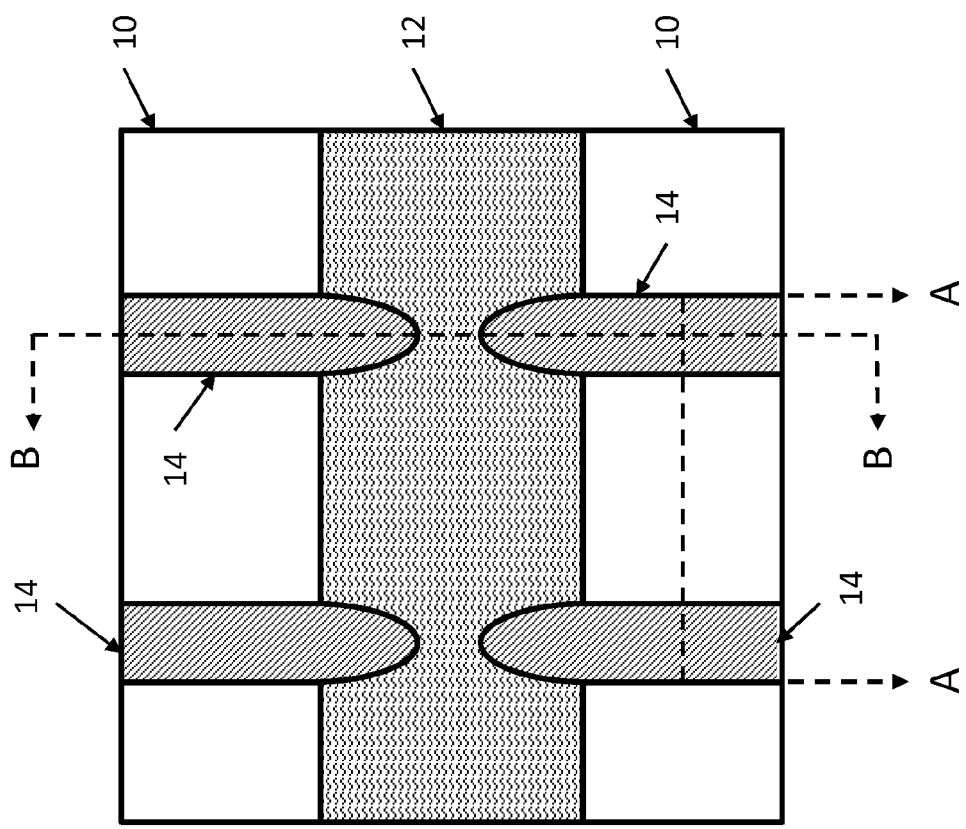
FIG. 1 is a layout of a portion of an SRAM structure according to an embodiment.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a static random access memory (SRAM) structure. Other embodiments may also be applied, however, to other semiconductor structures, such as dynamic random access memory (DRAM), logic circuitry, and the like.

FIG. 1 shows a layout of a portion of an SRAM structure. The layout includes active regions 10 in a substrate, an isolation region 12 in the substrate, and gate structures 14 on the substrate. Various portions of gate structures 14 and active regions 10 combine to form transistors in the SRAM structure. Line A-A is a line-to-line cross section illustrated by subsequent "A" figures, and line B-B is an end-to-end cross section illustrated by subsequent "B" figures.

FIGS. 2A and 2B illustrate an SRAM structure during processing. Particularly, the processing includes forming an isolation region 12 in a substrate 20. The isolation region 12 in this example is an oxide, such as silicon oxide, although other materials may be used. The isolation region 12 may be formed by etching a trench in the substrate 20 by acceptable photolithography techniques and forming an oxide or other material in the trench by thermal oxidation and/or chemical vapor deposition (CVD), although other techniques, such as local oxidation of silicon (LOCOS) or a flowable deposition can be used.

The processing further includes depositing a gate dielectric layer, gate electrode layer, and a hardmask layer over a substrate 20. The gate dielectric layer, gate electrode layer, and the hardmask layer may be any acceptable materials deposited by any acceptable technique. Specifically in this example, the hardmask layer is silicon oxide, although other materials may be used in other embodiments. The process also includes patterning the hardmask 26 by acceptable photolithography techniques and etching the gate electrode layer and the gate dielectric layer, for example, by an anisotropic etch, to form gates 24 and gate dielectrics 22, respectively.

The processing further includes depositing a spacer layer and patterning the spacer layer into spacers 28 along sidewalls of the gates 24 and gate dielectrics 22. The spacer layer in this example is silicon nitride (SiN), although other materials may be used in other embodiments, and may be deposited by acceptable deposition techniques. The spacer layer may be patterned using acceptable photolithography techniques.

The processing further includes etching a recess in source/drain regions of the active areas of the substrate 20 and epitaxially growing an epitaxial region 30 in the source/drain regions in the substrate 20. The etching may be by acceptable photolithography techniques. The epitaxial region 30 may be silicon germanium (SiGe), silicon phosphide (SiP), silicon carbide (SiC), the like, or a combination thereof, epitaxially grown by selective epitaxial growth (SEG), molecular beam epitaxy (MBE), the like, or a combination thereof. The structure is doped according to device requirements, including doping lightly doped source/drain (LDD) regions and doping source/drain regions.

Some of the processing includes photoresist strip steps that can include using hydrofluoric (HF) acid or a similar solvent or includes an oxide clean of, for example, isolation region 12 using HF acid or a similar solvent after epitaxially growing epitaxial region 30. During these steps, the HF or similar solvents can remove an exposed area of an isolation region 12 and leave a high aspect ratio first recess 32. The first recess 32 is in the isolation region 12 and between ends (end-to-end) of gate structures 14. The gate structures 14 each include a spacer 28, a gate dielectric 22, and a gate 24.

Example dimensions discussed herein are for a 20 nanometer (nm) technology node. It should be appreciated that the dimensions are examples only, and other dimensions can be used for a 20 nm technology node structure or for a different technology node. The first recess 32 has a depth 34 from approximately 120 nm to approximately 130 nm, for example, approximately 125 nm, from a top surface of the hardmask 26 to a bottom of the first recess 32. The first recess 32 has a width 36 from approximately 30 nm to approximately 35 nm, for example, approximately 31 nm, between spacers 28 and/or between sidewalls of the first recess 32 in an end-to-end direction. Thus, the first recess 32 has a high aspect ratio of the depth 34 to the width 36 of, for example, greater than or equal to four. For comparison, the distance 38 between spacers 28 in a line-to-line direction is approximately 54 nm.

In FIGS. 3A and 3B, a filler material 40 is deposited on the structure, particularly, in the first recess 32. The filler material 40 is conformally deposited on the structure including deposition on sidewalls until at least the filler material 40 along sidewalls in the first recess 32 merges such that the first recess 32 is filled, as shown in FIG. 3B. The filler material 40 does not merge between the gates 24 in the line-to-line direction in FIG. 3A. The filler material 40 in this example is SiN, and in other embodiments, the filler material 40 is silicon carbon nitride (SiCN), the like, or a combination thereof. The filler material 40 is deposited using atomic layer deposition (ALD), and in other embodiments, the filler material 40 is deposited using CVD, a thermal furnace deposition, the like, or a combination thereof.

In FIGS. 4A and 4B, the hardmask 26 and portions of the filler material 40 above a top surface of the gates 24 are removed. The hardmask 26 and the portions of the filler material 40 are removed using acceptable photolithography techniques, such as by using an anisotropic etch. The first recess 32 remains filled with the filler material 40 to the top surface of the gates 24 in the end-to-end direction of FIG. 4B, and some filler material 40 is conformally between the gates 24, although not merged, in the line-to-line direction of FIG. 4A.

In FIGS. 5A and 5B, further portions of the filler material 40 are removed. The filler material 40 between gates 24 in the line-to-line direction is removed, as shown in FIG. 5A. The removal may be acceptable photolithography techniques, such as by an anisotropic etch. The etch may also remove a portion of the filler material 40 in the first recess 32 in the end-to-end direction of FIG. 5B such that the filler material 40 has a top surface below a top surface of the gates 24. The top surface of the filler material 40 may be above, below, or coplanar with the top surface of the substrate 20.

In FIGS. 6A and 6B, an etch stop layer (ESL) 50 is formed over the structure. The ESL 50 is conformally deposited such that the ESL 50 is formed on sidewalls of the first recess 32, for example, on the spacers 28 in the end-to-end direction of FIG. 6B, where the portion of the filler material 40 was removed in FIG. 5B. The ESL 50 is also formed on the top surface of the filler material 40. The ESL 50 in this example is SiN, and in other embodiments, the ESL 50 is SiCN, the like, or a combination thereof. The ESL 50 is deposited using, for example, CVD, ALD, PVD, the like, or a combination thereof. The deposition of the ESL 50 in the first recess 32 below the top surface of the gates 24 results in a second recess 42 having a depth 46 and a width 48. The remaining portion of the first recess 32 is filled with the filler material 40 having a depth 44.

As with above, dimensions discussed herein are for a 20 nm technology node and are examples. After the hardmask 26 is removed, the depth of the first recess 32 from a top surface of the gates 24 to a bottom surface of the first recess 32 is between approximately 90 nm and approximately 100 nm, such as 95 nm. Thus, after the hardmask 26 removal, the first recess 32 has an aspect ratio of the depth to the width 36 of, for example, greater than or equal to three. The depth 46 of the second recess 42 is between approximately 30 nm and 35 nm, and the width 48 of the second recess 42 is between approximately 20 nm and 25 nm. The depth 44 of the filler material 40 in the first recess 32 is between approximately 60 nm and 65 nm. The second recess 42 has a lower aspect ratio than the first recess 32. For example, the second recess 42 has an aspect ratio of depth 46 to width 48 of approximately 1.5. The depth 46 is much less than the depth 44, such as approximately half of the depth 44.

In FIGS. 7A and 7B, an inter-layer dielectric (ILD) layer 52 is deposited on the structure, such as in the second recess 42. The ILD layer 52 in this example is silicon oxide, and in other embodiments, the ILD layer 52 is silicon oxycarbide (SiOC), borophosphosilicate glass (BPSG), phosphor-silicate glass (PSG), the like, or a combination thereof. In this example, the ILD layer 52 is deposited using a high density plasma (HDP) deposition, and in other embodiments, the ILD layer 52 is deposited using CVD, a flowable deposition, the like, or a combination thereof.

Embodiments may achieve advantages. First, a lower aspect ratio recess between ends of gates may have better gap filling properties when an ILD layer is deposited in the recess compared to a high aspect ratio recess. Thus, voids may be avoided between ends of gates. Further, the filler material may provide additional protection to the gates during a hardmask removal process. The filler material may remain on sidewalls of gate structures during the hardmask removal thereby providing further protection to reduce gate damage.

An embodiment is a semiconductor structure. The semiconductor structure comprises at least two gate structures on a substrate. The gate structures define a recess between the gate structures, and the recess is defined by a depth in a vertical direction. The depth is from a top surface of at least one of the gate structures to below a top surface of the substrate, and the depth extends in an isolation region in the substrate. The semiconductor structure further comprises a filler material in the recess. The filler material has a first thickness in the vertical direction. The semiconductor structure also comprises an inter-layer dielectric layer in the recess and over the filler material. The inter-layer dielectric layer has a second thickness in the vertical direction below the top surface of the at least one of the gate structures. The first thickness is greater than the second thickness.

Another embodiment is a semiconductor structure. The semiconductor structure comprises a first gate structure on a substrate and a second gate on the substrate. The first gate structure is at least partially over an isolation region, and the second gate structure is at least partially over the isolation region. The isolation region has a recess between the first gate structure and the second gate structure. The semiconductor structure also comprises a filler material in the recess and an inter-layer dielectric layer over the first gate structure and the second gate structure. The filler material has a first thickness, and the first thickness is in a first direction from a bottom surface of the recess towards a top surface of the substrate. A portion of the inter-layer dielectric layer is between the first gate structure and the second gate structure. The portion of the inter-layer dielectric layer has a second thickness, and the second thickness is in a second direction from a bottom surface of the inter-layer dielectric layer to a top surface of at least one of the first gate structure and the second gate structure. The second thickness is less than the first thickness.

A further embodiment is a method for forming a semiconductor structure. The method comprises providing a substrate, at least two gate structures being on the substrate, respective ends of the gate structures being over an isolation region in the substrate, a recess being in the isolation region between the gate structures; depositing a filler material in the recess and between the gate structures; and depositing an inter-layer dielectric layer over the filler material and over the gate structures, the inter-layer dielectric layer being between the gate structures, the inter-layer dielectric layer having a first distance from a top surface of at least one of the gate structures to a bottom surface of the inter-layer dielectric layer between the gate structures, the filler material having a second distance from a bottom of the recess to a top surface of the filler material, the second distance being greater than the first distance.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure comprising:
   at least two gate structures on a substrate, a recess being between the gate structures and extending in an isolation material of an isolation region in the substrate, the recess being defined by opposing sidewalls of the gate structures and opposing sidewalls of the isolation material, each of the opposing sidewalls of the isolation material having an edge adjoining an edge of a respective one of the opposing sidewalls of the gate structures, the recess being defined by a depth in a vertical direction, the depth being from a top surface of at least one of the gate structures to a surface of the isolation material below a top surface of the substrate;
   a filler material in the recess, the filler material having a first thickness in the vertical direction; and
   an inter-layer dielectric layer in the recess and over the filler material, the inter-layer dielectric layer having a second thickness in the vertical direction below the top surface of the at least one of the gate structures, the first thickness being greater than the second thickness.

2. The semiconductor structure of claim 1 further comprising an etch stop layer in the recess, the inter-layer dielectric layer being over the etch stop layer.

3. The semiconductor structure of claim 1, wherein the inter-layer dielectric layer in the recess has a width in a lateral direction, the lateral direction being from one of the gate structures towards another of the gate structures, a ratio of the second thickness to the width being equal to or less than 1.5.

4. The semiconductor structure of claim 1, wherein the recess has a width in a lateral direction, the width being from one of the gate structures to another of the gate structures, a ratio of the depth to the width being equal to or greater than 3.

5. The semiconductor structure of claim 1, wherein the filler material has a top surface higher than the top surface of the substrate.

6. The semiconductor structure of claim 1, wherein the filler material is silicon nitride.

7. A semiconductor structure comprising:
   a first gate structure on a top surface of a substrate, the first gate structure being at least partially over a top surface of an isolation material of an isolation region, the top surface of the substrate and the top surface of the isolation material being co-planar;
   a second gate structure on the top surface of the substrate, the second gate structure being at least partially over the top surface of the isolation material of the isolation region, a recess being between the first gate structure and the second gate structure and extending into the isolation material of the isolation region;
   a filler material in the recess, the filler material having a first thickness, the first thickness being in a first direction from a bottom surface of the recess towards a top surface of the substrate; and
   an inter-layer dielectric layer over the first gate structure and the second gate structure, a portion of the inter-layer dielectric layer being between the first gate structure and the second gate structure, the portion of the inter-layer dielectric layer having a second thickness, the second thickness being in a second direction from a bottom surface of the inter-layer dielectric layer to a top surface of at least one of the first gate structure and the second gate structure, the second thickness being less than the first thickness.

8. The semiconductor structure of claim 7, wherein the portion of the inter-layer dielectric has a width, the width being in a third direction from the first gate structure towards the second gate structure, a ratio of the second thickness to the width being 1.5 or less.

9. The semiconductor structure of claim 7, wherein the recess has a width, the width being in a third direction from the first gate structure towards the second gate structure, the bottom surface of the recess being a distance from the top surface of the at least one of the first gate structure and the second gate structure, a ratio of the distance to the width being 3 or greater.

10. The semiconductor structure of claim 7 further comprising an etch stop layer over and between the first gate structure and the second gate structure, the inter-layer dielectric layer being over the etch stop layer.

11. The semiconductor structure of claim 7, wherein the filler material has a top surface higher than the top surface of the substrate.

12. The semiconductor structure of claim 7, wherein the filler material is silicon nitride.

13. A semiconductor structure comprising:
   a substrate comprising an isolation region, the isolation region comprising an isolation material, a top surface of the substrate being co-planar with a top surface of the isolation material;
   a first gate structure on the substrate and at least partially over the isolation material;
   a second gate structure on the substrate and at least partially over the isolation material, a recess being between the first gate structure and the second gate structure and extending into the isolation material of the isolation region, a first sidewall of the first gate structure and a second sidewall of the second gate structure opposing the first sidewall defining a first portion of the recess, a third sidewall of the isolation material and a fourth sidewall of the isolation material opposing the third sidewall defining a second portion of the recess, the first sidewall corresponding vertically with the third sidewall, the second sidewall corresponding vertically with the fourth sidewall;

a filler material in the recess, the filler material having a first thickness in a vertical direction orthogonal to the top surface of the substrate; and an inter-layer dielectric layer over the first gate structure and the second gate structure, a portion of the inter-layer dielectric layer being between the first gate structure and the second gate structure, the portion of the inter-layer dielectric layer having a second thickness, the second thickness being in the vertical direction from a bottom surface of the inter-layer dielectric layer to a top surface of at least one of the first gate structure and the second gate structure, the second thickness being less than the first thickness.

14. The semiconductor structure of claim 13, wherein the portion of the inter-layer dielectric has a width, the width being in a direction parallel to the top surface of the substrate, a ratio of the second thickness to the width being 1.5 or less.

15. The semiconductor structure of claim 13, wherein the recess has a width, the width being in a direction parallel to the top surface of the substrate, a bottom surface of the recess being a distance from the top surface of the at least one of the first gate structure and the second gate structure, a ratio of the distance to the width being 3 or greater.

16. The semiconductor structure of claim 13 further comprising an etch stop layer over and between the first gate structure and the second gate structure, the inter-layer dielectric layer being over the etch stop layer.

17. The semiconductor structure of claim 13, wherein the filler material has a top surface higher than the top surface of the substrate.

18. The semiconductor structure of claim 13, wherein the filler material is silicon nitride.

\* \* \* \* \*